United States Patent [19]

Hiraki

[11] Patent Number: 5,298,338
[45] Date of Patent: Mar. 29, 1994

[54] TITANIUM-TUNGSTEN TARGET MATERIAL AND MANUFACTURING METHOD THEREOF

[75] Inventor: Akitoshi Hiraki, Yasugi, Japan

[73] Assignee: Hitachi Metals, Ltd., Tokyo, Japan

[21] Appl. No.: 914,545

[22] Filed: Jul. 16, 1992

Related U.S. Application Data

[63] Continuation-in-part of Ser. No. 708,340, May 31, 1991.

[30] Foreign Application Priority Data

Jun. 15, 1990 [JP] Japan .................. 2-157287
Nov. 27, 1990 [JP] Japan .................. 2-324910
Feb. 12, 1991 [JP] Japan .................. 3-040999

[51] Int. Cl.$^5$ ................................ B22F 7/00
[52] U.S. Cl. ......................... 428/569; 428/546; 428/567; 148/513; 419/48; 419/53
[58] Field of Search .............. 29/182.8; 75/65 EB, 75/150, 214, 230, 238, 248; 156/664; 204/15, 192.32; 357/71; 361/321; 419/8; 428/664, 569

[56] References Cited

U.S. PATENT DOCUMENTS

| | | | |
|---|---|---|---|
| 4,331,476 | 5/1982 | Helderman et al. | 75/214 |
| 4,838,935 | 6/1989 | Dunlop et al. | 75/230 |
| 4,862,318 | 8/1989 | Galvagni et al. | 361/321 |
| 5,160,534 | 11/1992 | Hiraki | 75/248 |

FOREIGN PATENT DOCUMENTS 3303017 12/1988 Japan .

OTHER PUBLICATIONS

International Journal of Refractory Metals and Hard Materials vol. 9, No. 3, Sep. 1990, Amsterdam, NL pp. 146-153, M. Yamauchi et al 'Development of W-TI Binary Alloy Sputtering Target and Study of its Sputtering Characteristics' p. 148, right-hand column "Microstructure of W-TI Binary Alloy".

Patent Abstracts of Japan, vol. 13, No. 137 (C-582) Apr. 1989 & JP-A-63 303 017 (Nippon Mining Co. Ltd.) Dec. 9, 1988.

Patent Abstracts of Japan vol. 16, No. 71 (C-913) Feb. 21, 1992 & JP-A-32 64 640 (Hitachi Metals Ltd.) Nov. 25, 1991.

Primary Examiner—Peter A. Nelson
Assistant Examiner—J. N. Greaves
Attorney, Agent, or Firm—Sughrue, Mion, Zinn, Macpeak and Seas

[57] ABSTRACT

A titanium-tungsten target material used to form, by sputtering, a barrier metal or the like for use in semiconductor devices. The titanium-tungsten target material is substantially composed of tungsten particles and a titanium-tungsten alloy phase surrounding the tungsten particles. The area ratio at which tungsten grains occupy in a cross section of the titanium-tungsten target material is, preferably, not more than 15%, more preferably, not more than 10%. If the average crystal grain size of the target material is not more greater 15 μm, a uniform thin film can be obtained by sputtering. The target material can be obtained by sintering a titanium powder and a tungsten powder.

7 Claims, 2 Drawing Sheets (600×)

(600×)

(600×)

F I G. 4
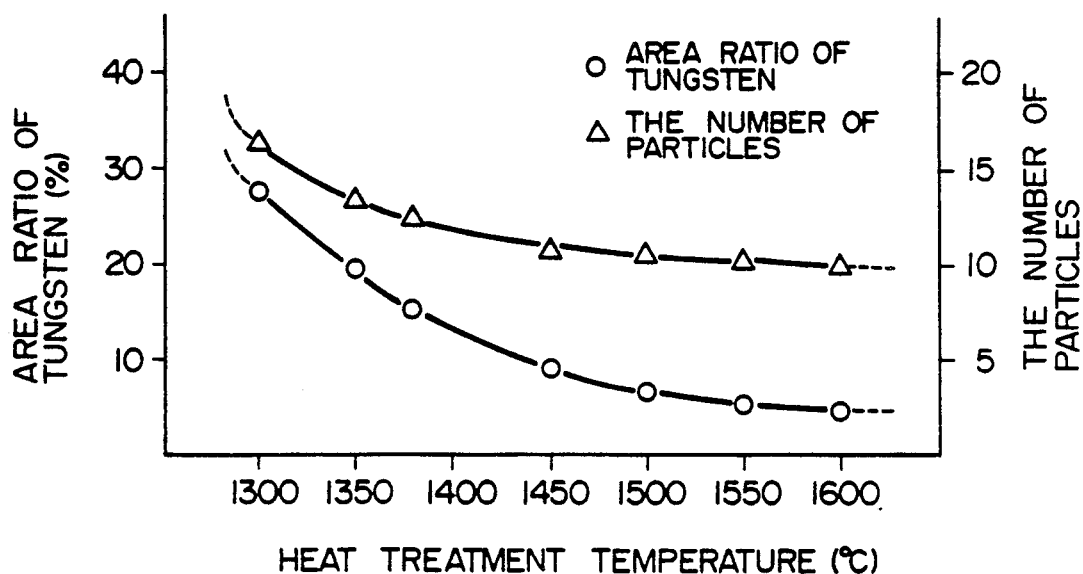
F I G. 5
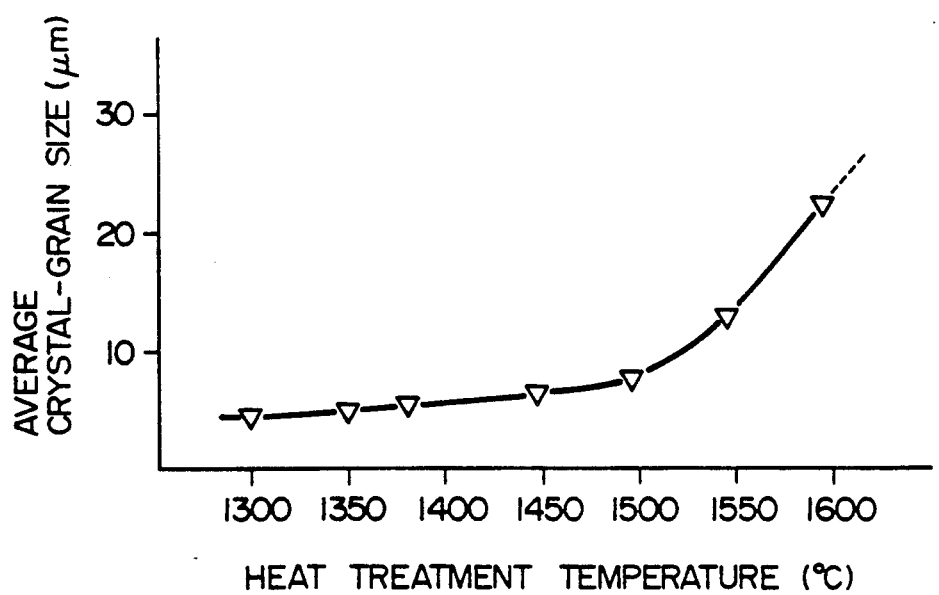

TITANIUM-TUNGSTEN TARGET MATERIAL AND MANUFACTURING METHOD THEREOF

CROSS REFERENCE TO RELATED APPLICATION

This is a continuation in part of patent application Ser. No. 07/708340 filed on May 31, 1991.

BACKGROUND OF THE INVENTION

This invention relates to a titanium-tungsten (titanium-tungsten) target material used to form a barrier metal layer or the like for use in semiconductor devices and to a method of manufacturing the titanium-tungsten target material.

With the increase in the degree of integration of large scale integrated circuits (LSIs), the need for a barrier metal layer as a means for avoiding aluminum wiring migration has arisen.

A titanium-tungsten thin film (typically composed of 10 wt % of titanium and the balance of tungsten) is often used as a barrier metal layer, and a method of sputtering a target is adopted to form such a titanium-tungsten thin film.

In general, a titanium-tungsten target material for the thin film is manufactured by blending a titanium powder and a tungsten powder and hot-pressing the blended powder.

However, no titanium-tungsten target having a suitably low oxygen content has been provided because a titanium powder used as a raw material for the conventional titanium-tungsten targets essentially have a large oxygen content, and also because the titanium powder is contaminated by oxygen when the titanium powder is milled more finely.

High-oxygen-content targets are disadvantageous because oxygen is liberated during sputtering to cause cracks in the target, oxidation of formed films, and variations in film quality.

Methods for reducing the oxygen content of a titanium-tungsten target are disclosed in U.S. Pat. No. 4,838,935 and JP-A-63-303017. In these methods, a hydrogenated titanium powder is used instead of the ordinary titanium powder.

The use itself of the hydrogenated titanium powder is effective in preventing oxidation and is also capable of limiting the amount of oxygen picked up during milling because the hydrogenated titanium powder may be more suitably milled with less contamination by oxygen as compared with the ordinary titanium powder.

It has thus become possible to obtain titanium-tungsten targets having an oxygen concentration as low as 900 pm or less.

Recently, with the development of semiconductor products having thinner conductors formed at a higher density, a new problem has arisen with respect to a sputtering process using the above-mentioned low-oxygen-concentration titanium-tungsten target in that large particles attach to a thin film formed by sputtering to cause disconnection of electrode wiring conductors.

The generation of such particles cannot be prevented as long as only the method for reducing the titanium-tungsten target oxygen content is used. It is supposed that the generation of such particles relates to coarse titanium grains existing in the titanium-tungsten target structure and segregation of titanium therein.

The inventor of the present invention has examined in detail the relationship between the target structure and the generation of particles, and has found that coarse titanium grains relate particularly to the generation of the particles. That is, titanium having an atomic weight lighter than that of tungsten is selectively sputtered faster so that cavities are formed in places where titanium has existed. Tungsten grains which have been surrounded by coarse titanium grains or groups of coarse titanium grains or located in the vicinity of coarse titanium particles are therefore scattered as large particles from the target material. The inventor has found this phenomenon as a cause of the generation of particles.

SUMMARY OF THE INVENTION

Thus, it is an object of the present invention to provide a titanium-tungsten target material whose structure is controlled so that the amount of generated particles is very small and a method of manufacturing this titanium-tungsten target material.

The inventor of the present invention has found that a process of heat treating a titanium-tungsten target material at particular temperatures at which a titanium phase is effectively diffused and at which crystal grains can be prevented from being excessively coarsened in size to form a titanium-tungsten alloy phase so that there is substantially no titanium phase in the resulting material is effective in forming a target material free from scattering of tungsten particles due to the difference between the sputtering speeds of titanium and tungsten.

That is, the present invention provides a titanium-tungsten target material characterized by being substantially composed of tungsten phase and a titanium-tungsten alloy phase surrounding the tungsten phase.

In the target material of the present invention, a material formed by sintering a titanium powder and a tungsten powder is heat-treated at temperatures in a particular temperature range to form a titanium-tungsten alloy phase so that there is substantially no titanium phase in the resulting material.

If the titanium phase is eliminated in this manner, titanium having a lighter atomic weight is prevented from being selectively sputtered, so that the amount of generated particles can be remarkably reduced.

By the above-described heat treatment of the present invention, tungsten phase is also reduced by alloying with titanium. However, it is preferable that the area ratio at which tungsten phase occupy in a cross section of the titanium-tungsten target material be 15% or less.

For uniform sputtering, it is preferable to reduce the amount of tungsten phase. However, a particularly uniform thin film can be formed if the ratio at which they occupy in a target material cross-section is 10% or less.

In accordance with the present invention, if the average crystal grain size is set to, specifically, 15 $\mu$m or smaller, the influence of the crystal orientation of each crystal grain is reduced and a uniform thin film can be obtained by sputtering. In accordance with the present invention, increasing the heat treatment temperature is advantageous in terms of diffusion of titanium. However, to set the crystal grain size to 15 $\mu$m or smaller, a heat treatment temperature not higher than 1550° C. is suitable. If a further smaller average grain size, e.g., 10 $\mu$m or smaller is required, it is desirable to set the heat treatment temperature to a level not higher than 1500° C.

Therefore, the titanium-tungsten target in accordance with the present invention can be obtained in the following manner. A tungsten powder and a hydrogenated titanium powder having an average grain size of 25 μm or smaller are blended and milled. The blended powder is finely milled until an average grain size less than 5 μm and a maximum grain size smaller than 10 μm are obtained. The powder is then press-sintered after or while being processed for dehydrogenation to form a sintered material. The sintered material thereby obtained is heat-treated at 1300° to 1550° C. to form a structure substantially composed of tungsten phase and a titanium-tungsten alloy phase surrounding the tungsten plate.

The grain size of the titanium powder is set to 25 μm or smaller in order to enable the mixture powder to be easily milled finely in the blending/milling step so that the reaction of titanium into the titanium-tungsten alloy is promoted.

It is preferable that the grain size of hydrogenated titanium be as small as possible, if the conditions for preventing oxidation of tungsten grains are maintained.

For the blending/milling step, a ball mill, a high energy ball mill (Attoritor Union Process Co.) or the like capable of blending/milling may be used. Blending/milling referred to in this specification may be performed by performing milling and blending separately or simultaneously so that the titanium powder and the tungsten powder are suitably blended to form a fine powder.

By this blending/milling step, the hydrogenated titanium powder and tungsten powder are finely milled until the mixture powder has an average grain size smaller than 5 μm and a maximum grain size smaller than 10 μm. Finely milling the powder in this manner is important because the effect of increasing the reaction interface area so that the titanium phase is eliminated substantially completely while the growth of crystal grains is limited can be thereby obtained.

In particular, if the maximum grain size exceeds 10 μm, the titanium phase remains even if the heat treatment is performed for a long time, which effect is undesirable in terms of practice.

The obtained sintered material is heat-treated at 1300° to 1500° C. in order to generate the titanium-tungsten alloy phase while limiting the growth of crystal grains by the diffusion reaction caused by the heating. In the case of heating at a temperature higher than 1550° C., the grain size of the sintered material becomes excessively large since the raw material is formed of substantially pure titanium and tungsten. The influence of crystal orientation is thereby increased, resulting in failure to obtain a uniform thin film. If the heat treatment temperature is lower than 1300° C., the extent of alloying is very small even after 50 hours, which is undesirable in terms of practice.

For the above-mentioned press-sintering, a hot isostatic press (hereinafter referred to as "HIP") or an ordinary hot press can be used.

It is preferable that the densities of impurities such as oxygen and radioactive elements in the titanium power, the hydrogenated titanium and the tungsten powder used as raw materials be as low as possible. If oxygen is mixed, the thin film electrical properties are deteriorated. If a radioactive element is mixed, a risk of a malfunction or breakdown of the semiconductor device arises.

BRIEF DESCRIPTION OF THE DRAWINGS

FIG. 4 is a diagram showing the relationship between the tungsten area ratio, the number of generated particles and the alloying heat treatment temperatures of a target in accordance with the present invention; and FIG. 5 is a diagram showing the relationship between the average crystal grain size and the alloying heat treatment temperatures of the target in accordance with the present invention.

DESCRIPTION OF THE PREFERRED EMBODIMENTS

Examples

Example 1

Hydrogenated high-purity titanium (having 99.99% or higher purity and a 75 μm or less average grain size, hereinafter referred to as hydrogenated titanium) classified with a sieve of 500 mesh (25 μm) and a high-purity tungsten powder (having a 99.99% or higher purity and a 5 μm or less average grain size) were blended together so as to set a hydrogenated titanium content of 10.36 wt %. The mixture powder obtained was put in a special ball mill having a pot with a tungsten lining and tungsten balls, and the interior of the pot was evacuated to substitute Ar gas to provide a non-oxidizing atmosphere. In this atmosphere, the material was blended for 90 minutes while being milled.

The mixture powder thereby obtained has an average grain size of 3.1 μm and a maximum grain size of 8 μm.

Also, the oxygen content of the mixture powder was 820 ppm.

The obtained mixture powder was packed in a HIP-can having an inside diameter of 400 mm and was dehydrogenated by being heated at 700° C. for 24 hours while evacuating the can at $5 \times 10^{-5}$ torr. The can was sealed after the dehydrogenation, and a HIP treatment was then performed at 1250° C. and 1000 atm for 2 hours.

Figure 2:
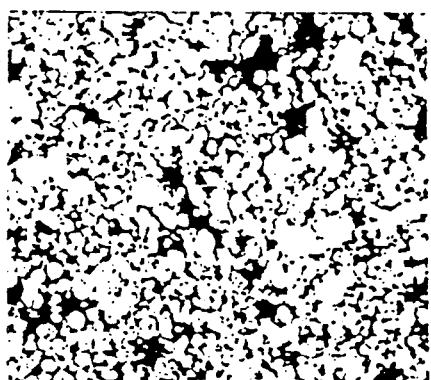
FIGS. 2 and 3 are photographs of the metal structure of target materials provided as reference examples.

FIG. 2 shows a photograph of the structure of the obtained sintered material magnified 600 times. In FIG. 2, white grains are tungsten grains, and gray portions existing between the tungsten grains are titanium grains. As shown in FIG. 2, no titanium-tungsten alloy phase was confirmed at this stage. The average crystal grain size of the sintered material at this time was 4 μm.

This sintered material was heat-treated for alloying at a degree of vacuum of $10^{-5}$ torr and at 1380° C. for 24 hours, thereby obtaining a target material.

The oxygen content of the obtained target material was approximately 850 ppm, and the average crystal grain size was 6 μm.

Figure 1:
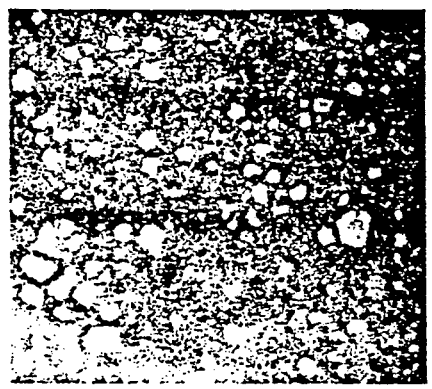
FIG. 1 is a photograph of the metal structure of an example of the target material in accordance with the present invention.

FIG. 1 shows a photograph of the structure of the obtained target material magnified 600 times.

In FIG. 1, white portions are tungsten phases while gray portions substantially surrounding the tungsten phases correspond to titanium-tungsten alloy phases.

As shown in FIG. 1, the target material in which no titanium-phase was observed could be obtained.

This target material was machined into a target plate having a diameter of 300 mm, and the target was used in a sputtering process to deposit the target material on a 6 inch wafer.

The number of particles in the sputtered film was examined. It was thereby found that the number of particles was very small, that is, the number of particles having of 0.5 μm or greater was five and the number of particles of 0.3 μm or greater was twelve.

COMPARATIVE EXAMPLE 1

A sintered material having the same structure as that shown in FIG. 2 was obtained by a HIP treatment under the same conditions as Example 1. This sintered material was directly machined into a target plate having a diameter of 300 mm without performing the alloying heat treatment of Example 1.

This target is used in a sputtering process to deposit the target material on a six inch wafer under the same conditions as Example 1.

The number of particles in the sputtered film was examined. The number of particles having of 0.5 μm or greater was 30 and the number of particles of 0.3 μm or greater was 140, which numbers are much greater than those in Example 1 and are disadvantageously large.

COMPARATIVE EXAMPLE 2

In this example, a titanium powder having a greater grain size was used as a raw-material titanium powder and the extent of particle generation was examined.

Hydrogenated high-purity titanium (having 99.99% or higher purity and a 75 μm or smaller average grain size, hereinafter referred to as hydrogenated titanium) not classified and a high-purity tungsten powder (having a 99.99% or higher purity and a 5 μm or smaller average grain size) were blended together so as to set a hydrogenated titanium content of 10.36 wt %. The mixture powder obtained was put in a special ball mill having a pot with a tungsten lining and tungsten balls, and the interior of the pot was evacuated to substitute a Ar gas to provide a non-oxidizing atmosphere. In this atmosphere, the material was mixed for 90 minutes while being pulverized.

The mixture powder thereby obtained has an average grain size of 4.0 μm and a maximum grain size of 19 μm.

The obtained mixture powder was packed in a HIP-can having an inside diameter of 400 mm and was dehydrogenated by being heated at 700° C. for 24 hours while evacuating the can at $5 \times 10^{-5}$ torr, as in the case of Example 1. The can was sealed after the dehydrogenation, and a HIP treatment was then performed at 1250° C. and 1000 atm for 2 hours.

The obtained sintered material was processed by the same alloying treatment as Example 1 to obtain a target material.

The oxygen content of the obtained target material was 550 ppm, and the average crystal grain size was 6 μm.

Figure 3:

FIG. 3 shows a photograph of the structure of the obtained target material. In FIG. 3, white portions are tungsten grains, gray portions substantially surrounding the tungsten grains correspond to a titanium-tungsten alloy phase, and black portions existing in the titanium-tungsten phase correspond to a titanium phase. Thus, if the grain size of the raw material hydrogenated titanium powder exceeds 25 μm, it remains partially as titanium-phase even if the sintered material is heat-treated.

This target material was machined into a target plate having a diameter of 300 mm, and this target was used in a sputtering process to deposit the target material on a six inch wafer.

The number of particles in the sputtered film was examined. The number of particles having of 0.5 μm or greater was eight, which is roughly equal to that in Example 1, but the number of particles of 0.3 μm or greater was 40, which is much greater than that in Example 1. It is thereby confirmed that the material having substantially no tungsten phase in accordance with the present invention is superior.

Example 2

A sintered material was obtained in the same manner as example 1 but it was heat-treated for alloying at a degree of vacuum of $10^{-5}$ torr four 24 hours while changing the heat treatment temperature, thereby obtaining a target material.

The obtained target material was machined into a target plate having a diameter of 300 mm.

This target was used in a sputtering process to deposit the target material on a six inch wafer, and the generation of particles of 0.3 μm or greater was observed.

FIG. 4 shows the relationship between the tungsten area ratio, the number of generated particles and the alloying heat treatment temperatures of this target.

With respect to this Example in which the heat treatment was performed at 1300° C. or higher, it was confirmed by target structure observation that the whole structure contained substantially no titanium-phase.

As can be understood from FIG. 4, as the heat treatment temperature is increased, the tungsten area ratio is reduced and the number of generated particles is also reduced. A smaller tungsten area ratio is preferred if the reduced in the number of particles is considered. However, when the tungsten area ratio is not greater than 15%, the number of particles does not depend substantially upon the tungsten area ratio. It is therefore preferable that the tungsten area ratio is 15% or smaller.

FIG. 5 shows the relationship between the average crystal grain size and the alloying heat treatment temperatures measured by observing a cross section of the target.

It is understood from FIG. 5 that, if the alloying heat treatment temperature exceeds 1550° C., the average crystal grain size increases abruptly, and a heat-treatment at a temperature above 1550° C. is undesirable.

If the titanium-tungsten target material of the present invention capable of limiting the generation of particles very effectively enables high-quality sputtering and is therefore effective in improving the qualities of semiconductor devices. Also, the oxygen content of the target material of the present invention is so small that occurrence of cracks in the target and deteriorations in electrical characteristics due to oxidation of formed thin films can be prevented and the effect of limiting variations in the qualities of thin films can also be achieved.

I claim:

1. A titanium-tungsten target material consisting essentially of a tungsten phase and a titanium-tungsten alloy phase surrounding the tungsten phase.

2. A titanium-tungsten target material consisting essentially of a tungsten phase and a titanium-tungsten alloy phase surrounding the tungsten phase, wherein the average crystal grain size is not greater than 15 μm.

3. A titanium-tungsten target material according to claim 1 or 2, wherein the area ratio at which tungsten phase occupy in a cross section of the titanium-tungsten target material is not more than 15%.

4. A method of manufacturing a titanium-tungsten target, comprising the steps of:
blending and milling a tungsten powder and a hydrogenated titanium powder having a grain size not greater than 25 μm so that a milled powder having an average grain size smaller than 5 μm and a maximum grain size smaller than 10 μm are obtained;
press-sintering the powder after or during a dehydrogenation treatment to form a sintered material; and
heating the sintered material at 1300° to 1550° C. to form a target consisting essentially of a tungsten phase and a titanium-tungsten alloy phase surrounding the tungsten phase.

5. A titanium-tungsten target material according to claim 1 not containing a titanium phase.

6. A titanium-tungsten target material according to claim 2 not containing a titanium phase.

7. A method according to claim 4, wherein the press-sintered and heat-treated titanium-tungsten target does not contain a titanium phase.

* * * * *